United States Patent [19]

Pascucci

[11] Patent Number: 5,831,915
[45] Date of Patent: Nov. 3, 1998

[54] MEMORY DEVICE WITH CLOCKED COLUMN REDUNDANCY

[75] Inventor: Luigi Pascucci, Sesto San Giovanni, Italy

[73] Assignee: SGS-Thomson Microelectronics S.r.l., Agrate Brianza, Italy

[21] Appl. No.: 868,213

[22] Filed: Jun. 3, 1997

[30] Foreign Application Priority Data

Jun. 6, 1996 [EP] European Pat. Off. .............. 96830325

[51] Int. Cl.$^6$ ...................................................... G11C 7/00
[52] U.S. Cl. ...................................... 365/200; 365/189.02
[58] Field of Search ................................ 365/200, 189.02

[56] References Cited

U.S. PATENT DOCUMENTS 4,811,298  3/1989  Helwig et al. .......................... 365/200
5,708,601  1/1998  McKenny et al. .................. 365/200 X

FOREIGN PATENT DOCUMENTS

A-0 668 562  8/1995  European Pat. Off. .

Primary Examiner—Do Hyun Yoo
Attorney, Agent, or Firm—Wolf, Greenfield & Sacks, P.C.

[57] ABSTRACT

A semiconductor memory device including: at least one output data terminal; a matrix of memory cells having a plurality of columns of memory cells; multiplexer circuitry associated with the matrix of memory cells for selectively coupling one of the columns to respective sensing circuitry driving the output data terminal; redundancy columns of redundancy memory cells for functionally replacing defective columns in the matrix; first registers for storing defective addresses of the defective columns in the matrix, for comparing the defective addresses with a current address supplied to the memory device and for selecting a redundancy column when the current address coincides with one of the defective addresses; circuitry for generating an internal timing signal activated upon changing of a current address supplied to the memory device, the internal timing signal remaining activated for a prescribed time starting from the beginning of a read cycle of the memory device. The memory device includes: redundancy sensing circuitry associated with the redundancy columns, and redundancy control circuitry controlled by the internal timing signal for coupling the output data terminal of the memory device to the redundancy sensing circuitry in alternative to the sensing circuitry when the current address supplied to the memory device is a defective address, the redundancy control circuitry maintaining the output data terminal of the memory device coupled to the sensing means independently of the current address being a defective address as long as the internal timing signal is activated.

11 Claims, 5 Drawing Sheets

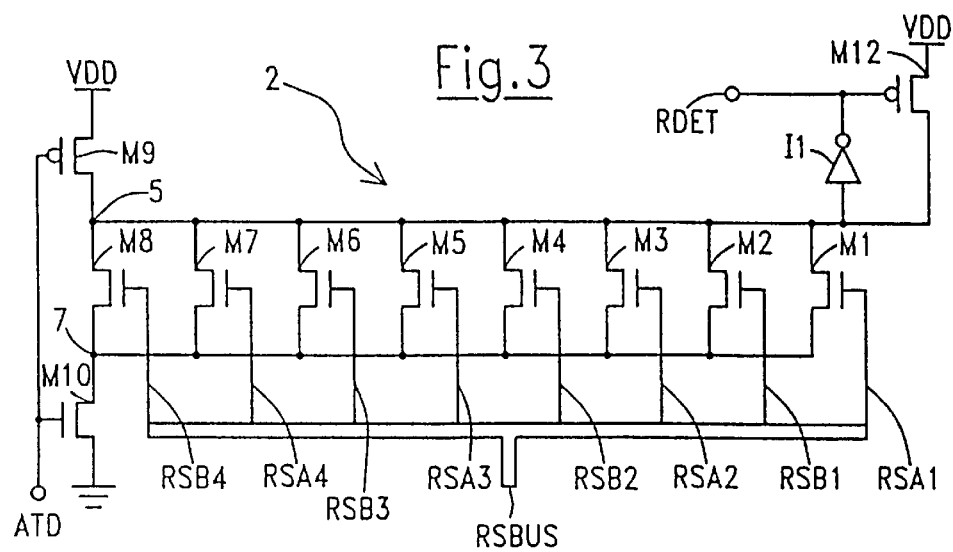
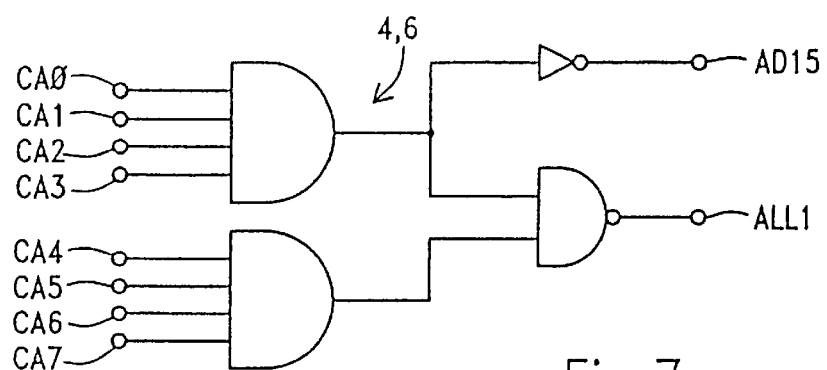

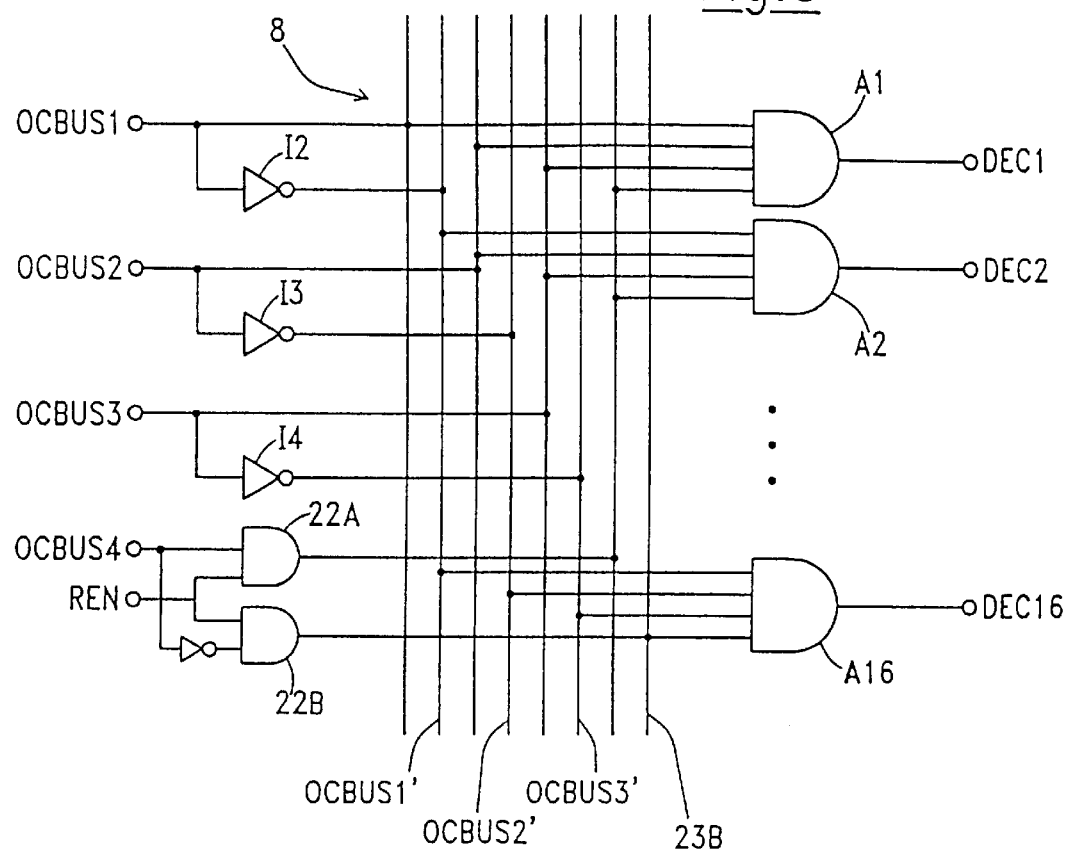
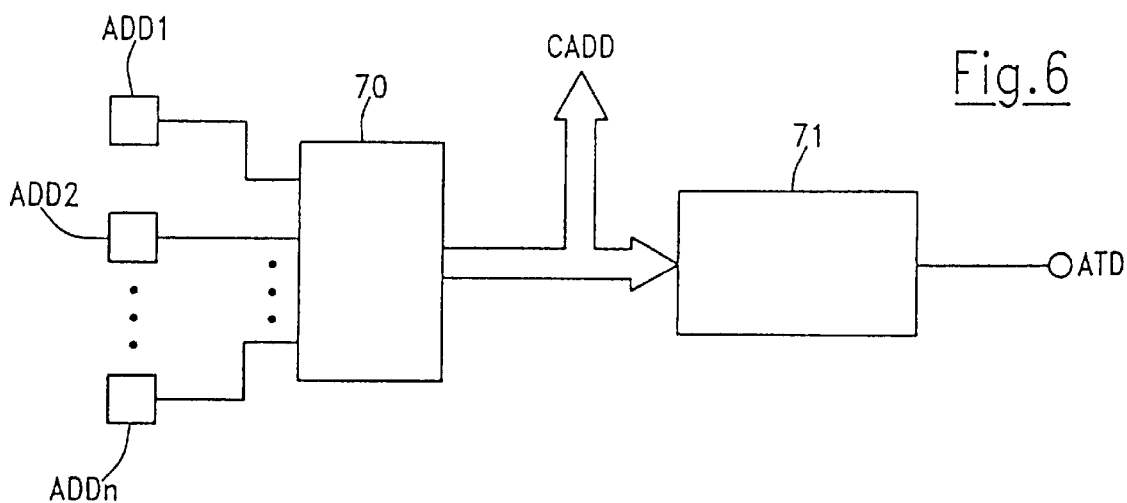

MEMORY DEVICE WITH CLOCKED COLUMN REDUNDANCY

BACKGROUND OF THE INVENTION

1. Field of the Invention

The present invention relates to a memory device with clocked column redundancy.

2. Discussion of the Related Art

In semiconductor memory devices redundancy memory elements are conventionally provided for functionally replacing defective memory elements: for example, since semiconductor memory devices comprise a matrix of memory cells arranged in rows (word lines) and columns (bit lines), redundancy bit lines are provided for functionally replacing defective bit lines in the memory matrix.

When redundancy bit lines are provided, a column redundancy circuit is also provided for storing addresses of the defective bit lines (defective addresses), comparing the stored defective addresses with a current address supplied to the memory device, preventing the activation of the addressed defective bit line and activating in substitution a redundancy bit line.

In asynchronous memory devices, such as for example EPROMs, EEPROMs and Flash EEPROMs, for which no external timing signals are provided, it is convenient to generate internal timing signals to provide a time basis for the read operation. Most commonly, the access to the matrix memory element is triggered by a change in the address configuration supplied to the memory device; an internal timing signal, known as Address Transition Detection (ATD) signal, is generated when such a change in the address configuration is detected, and the ATD signal provides the timing of the read operation: for example, the ATD signal is used to preset the sensing circuits.

Normally, the activation of a redundancy bit line when a defective bit line address is supplied to the memory device follows a path which is parallel to that leading to the selection of the matrix bit lines, and the redundancy bit line selection path is asynchronous, i.e. not synchronized with the internal timing signal. As soon as the redundancy circuit recognizes that the current address is a defective address, it inhibits the activation of the defective bit line, for example by disabling the column address decoder, and enables the selection of the redundancy bit line.

The problem arises when, after a defective bit line has been addressed, a non-defective bit line is addressed in the next read operation: since in the preceding read cycle the column address decoder has been disabled, it is impossible to start the selection of the non-defective bit line until the redundancy circuit recognizes that the new address supplied to the memory device is not a defective address; this time delay causes a lengthening of the access time of the memory device.

In view of the state of the art described, it is an object of the present invention to provide a novel column redundancy architecture for a semiconductor memory device suitable to overcome at least the above-mentioned problem.

SUMMARY OF THE INVENTION

According to the present invention, this and other objects are achieved by means of a semiconductor memory device comprising:

at least one output data terminal;
a matrix of memory cells comprising a plurality of columns of memory cells;
multiplexer means associated with said matrix of memory cells for selectively coupling one of said columns to respective sensing means driving said output data terminal;
redundancy columns of redundancy memory cells for functionally replacing defective columns in said matrix;
first means for storing defective addresses of said defective columns in said matrix, for comparing said defective addresses with a current address supplied to the memory device and for selecting a redundancy column when the current address coincides with one of said defective addresses;
means for generating an internal timing signal activated upon changing of a current address supplied to the memory device, the internal timing signal remaining activated for a prescribed time starting from the beginning of a read cycle of the memory device;
redundancy sensing means associated with said redundancy columns;
redundancy control means supplied by the internal timing signal for coupling said output data terminal of the memory device to said redundancy sensing means in alternative to said sensing means when the current address supplied to the memory device is a defective address, said redundancy control means maintaining the output data terminal of the memory device coupled to said sensing means independently of the current address being a defective address as long as the internal timing signal is activated.

BRIEF DESCRIPTION OF THE DRAWINGS

The features of the present invention will be made more evident by the following detailed description of a preferred embodiment thereof, illustrated as a non-limiting example in the annexed drawings, wherein:

FIG. 3 is a circuit diagram of a redundancy detector of the column redundancy circuit of FIG. 1;

FIG. 4 is a circuit diagram of a redundancy read path selector of the column redundancy circuit of FIG. 1;

FIG. 5 is a circuit diagram of a decoder circuit for the redundancy read path selector of FIG. 4;

FIG. 6 is a schematic diagram of a circuit for generating an internal timing signal for the memory device;

FIG. 7 is a circuit diagram of address configuration detector means for the redundancy circuit of FIG. 1;

DETAILED DESCRIPTION

Figure 1:
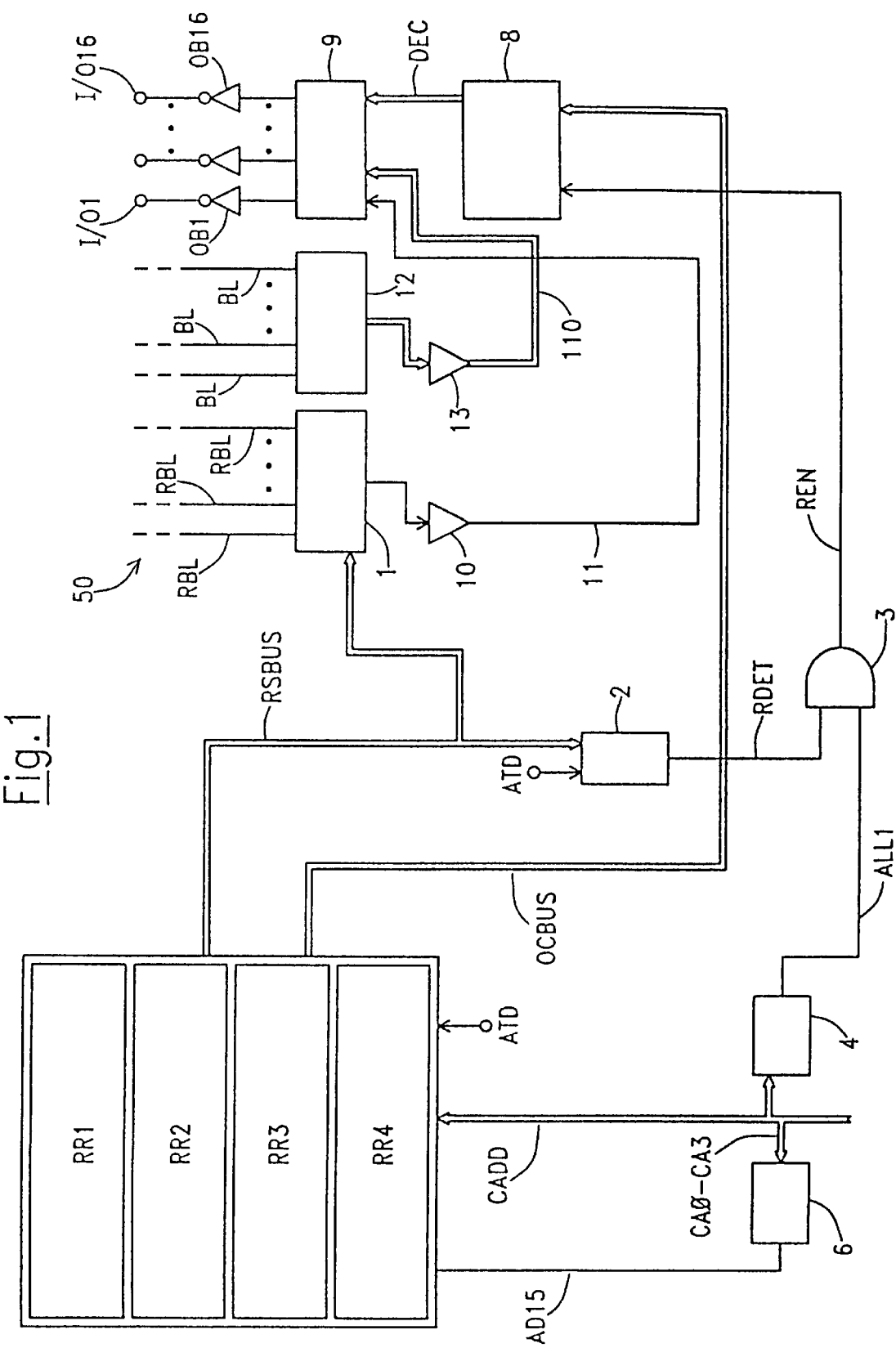
FIG. 1 is a schematic block diagram of a column redundancy circuit for a semiconductor memory device according to the present invention.

Referring to FIG. 1, a column redundancy circuit according to the present invention for a semiconductor memory device is schematically shown. The column redundancy circuit can be integrated in a semiconductor memory device to allow the functional substitution of redundancy bit lines of redundancy memory cells for defective bit lines of memory cells of a memory matrix.

Conventionally, in semiconductor memory devices the memory matrix is divided in portions, each one associated with a respective bit of an output data word of the memory device: for example, byte-organized memory devices having an eight-bit output data word comprise eight matrix portions, while memory devices having a sixteen-bit output data word comprise sixteen matrix portions. Each portion of the memory matrix is made up of a respective packet of bit lines of memory cells; each packet of bit lines is associated with a respective sensing circuit which in turn supplies a respective output buffer. When the memory device is operated in read mode, for every configuration of address signals supplied to the memory device one bit line in each packet is selected.

The column redundancy circuit comprises a plurality (four in the shown example) of programmable non-volatile memory registers RR1–RR4 (redundancy registers) for storing addresses of defective matrix bit lines (defective addresses). In the example shown, as will be better explained in connection with FIG. 2, each redundancy register is capable of storing two defective addresses; however, this is not to be intended as a limitation of the present invention: more generally, the invention finds application also in column redundancy circuits comprising redundancy registers each one capable of storing a single defective address.

The redundancy registers RR1–RR4 are supplied with a bus CADD of column address signals which supplies to the memory device in order to select one bit line in each packet of bit lines of the memory matrix, and with an internal timing signal ATD, generated internally to the memory device in a way that will be further explained later on.

The redundancy registers RR1–RR4 generate redundancy bit line selection signals which in FIG. 1 are shown grouped in a bus RSBUS. The redundancy selection signals of bus RSBUS control a redundancy bit line multiplexer 1 which allows to select one redundancy bit line RBL out of a packet 50 of redundancy bit lines. The signals of bus RSBUS also supply a redundancy detector 2 which is further supplied by the internal timing signal ATD.

The redundancy detector 2 generates an output signal RDET which is supplied to a first input of an AND gate 3; a second input of AND gate 3 is supplied by an output signal ALL1 generated by a first address configuration detector 4, supplied by all the column address signals of bus CADD.

In the column redundancy circuit according to the present invention, a single packet of redundancy bit lines is provided for all the packets of bit lines forming the portions of the memory matrix associated with the bits of the output data word of the memory device. When a defective bit line is detected in one of said packets of bit lines, the defective bit line is functionally replaced by a redundancy bit line of the packet of redundancy bit lines; all the bit lines belonging to the other packets of matrix bit lines but having the same address of the defective bit line are not replaced by redundancy bit lines.

In order to accomplish the above-mentioned operation, the redundancy registers RR1–RR4 must store not only the address of the defective bit line, but also information suitable for identifying the packet of matrix bit lines to which the defective bit line belongs. Such information are advantageously stored in the form of a digital code suitable for identifying one packet of bit lines among all the existent bit line packets. The identifying digital code is supplied to a bus of signal lines OCBUS.

A second address configuration detector 6, supplied by a sub-set CA0–CA3 of the column address signals of bus CADD (in the present example, the four least significant bits of the column address code), generates a signal AD15 which is supplied to the redundancy registers RR1–RR4.

The bus OCBUS and an output signal REN of AND gate 3 supply a decoder circuit 8 which performs a decoding of the identifying digital code carried by bus OCBUS. The decoder circuit 8 generates a plurality of decoded output signals (shown grouped in a bus DEC) which supply an output buffer input selector 9 whose output signals drives output buffer circuits OB1–OB16 which in turn drive output data terminals I/O1–I/O16 of the memory device. Depending on the configuration of the signals of bus OCBUS, and provided that signal REN is activated, only one of the decoded output signals of the decoder circuit 8 will be activated. If instead signal REN is not activated, none of the decoded output signals of the decoder circuit 8 is activated, independently of the configuration of the signals of bus OCBUS.

The output of the redundancy bit line multiplexer 1 supply a redundancy sense amplifier 10 which generates a redundancy read data signal 11 supplying the output buffer input selector 9.

Also schematically shown in FIG. 1 are matrix bit lines BL supplying a multiplexer 12 which allows selection of one addressed matrix bit line in each packet of bit lines and to electrically connect each selected bit line of each packet to a respective sense amplifier of a group of sense amplifiers 13. Output signals of the sense amplifiers 13 (shown in FIG. 1 as grouped in a bus 110) are supplied to the output buffer input selector 9.

Figure 2:
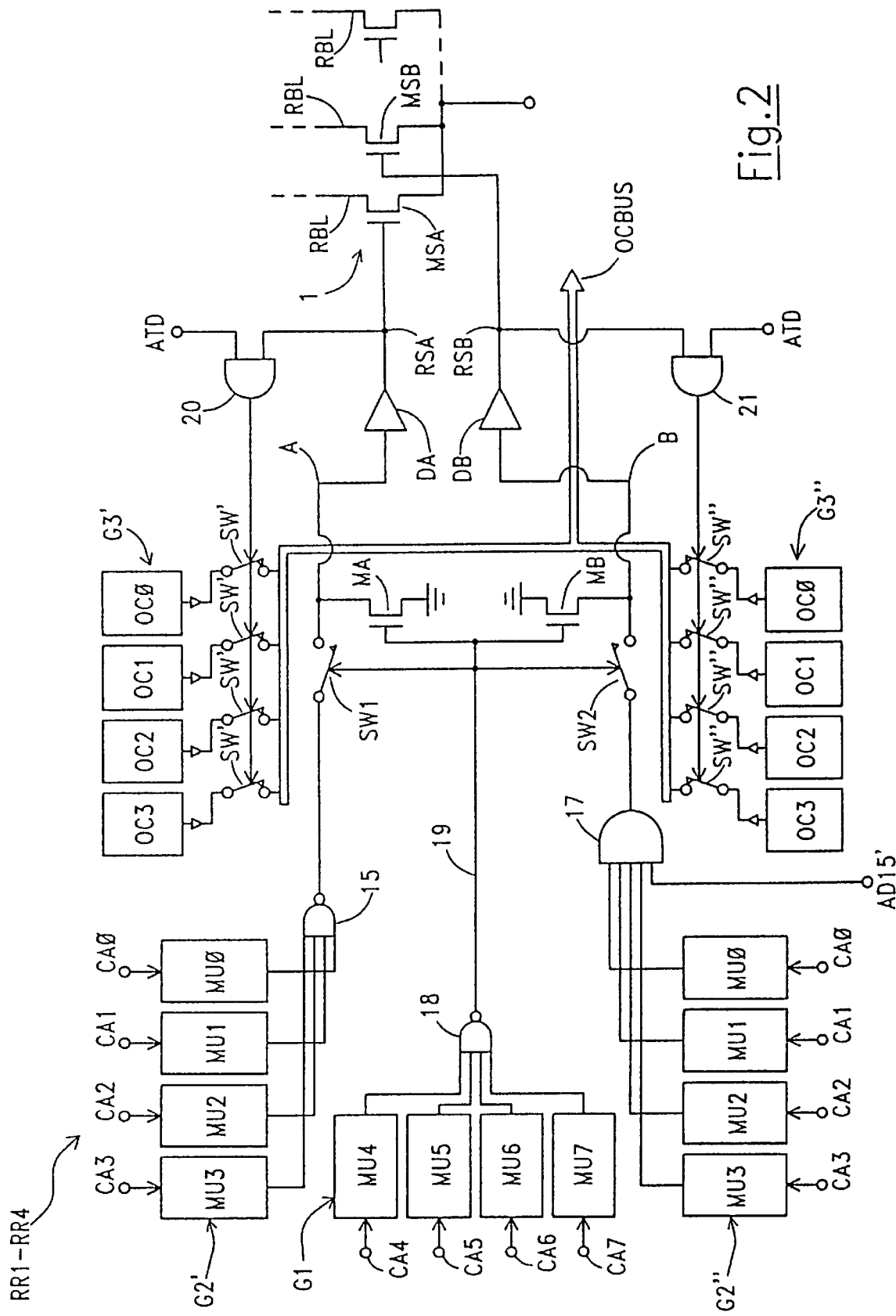
FIG. 2 is a schematic block diagram of a column redundancy memory register of the column redundancy circuit of FIG. 1.

FIG. 2 is a schematic diagram of one of the four column redundancy memory registers RR1–RR4. The redundancy register comprises a first group G1 of memory units MU4–MU7 associated with respective column address signals CA4–CA7 representing for example the four most significant bits of the column address code; a second group G2' of memory units MU0–MU3 associated with respective column address signals CA0–CA3 representing the four least significant bits of the column address code; and a third group G2" of memory units MU0–MU3 also associated with the column address signals CA0–CA3. Each one of the memory units MU0–MU7 is capable of storing a defective address bit and comparing the defective address bit stored therein with the respective current address signal CA0–CA7. The redundancy register is thus capable of storing two defective addresses sharing the most significant bits.

Each memory unit MU0–MU7 has a respective output signal which is activated (high logic level) when the respective current address signal CA0–CA7 coincides with the defective address bit stored therein. The output signals of memory units MU0–MU3 in the second group G2' are supplied to an AND gate 15 whose output supplies a first terminal of a first switch SW1. The output signals of the memory units MU0–MU3 in the third group G2" supply an AND gate 17 which is also supplied by the signal AD 15 generated by the address configuration detector circuit 6 of FIG. 1; the output of AND gate 17 supplies a first terminal of a second switch SW2. The output signals of the memory units MU4–MU7 in the first group G1 supply a NAND gate 18 whose output signal 19 controls switches SW1 and SW2 to close when it is activated (low logic level). Signal 19 also controls the activation of two pull-down N-channel MOSFETs MA, MB respectively connected between a second terminal A, B of switches SW1 and SW2 and ground. The second terminals A and B of switches SW1 and SW2 respectively supply two redundancy bit line drivers DA, DB whose outputs forms two redundancy bit line selection signals RSA and RSB of bus RSBUS. Signals RSA and RSB drive respective MOSFETs MSA, MSB of the redundancy bit line multiplexer 1. Logic gates 15, 16, 17 and 18 can obviously be substituted with any other combination of logic gates, provided the latter implement the same logic function.

Associated with the memory units MU0–MU3 of group G2' is a group G3' of memory units OC0–OC3 storing a four-bit identifying code suitable to identify one of the bit line packets of the memory matrix to which a defective bit line whose address is stored in groups G1 and G2' of memory units belongs. Each one of the four memory units OC0–OC3 stores a respective bit of said identifying code. The memory units OC0–OC3 have a structure slightly simpler than that of memory units MU0–MU7 in groups G1, G2' and G2", because while the latter must store a bit of information and compare the stored bit with an external information bit, the former must only store a bit of information and no comparison must be performed with external information bits. In this example, it has been assumed that the memory device has a sixteen-bit output data word, so that a four-bit identifying code is necessary to identify one bit line packet among sixteen.

Similarly, associated with group G2" is another group G3" of memory units OC0–OC3 identical to those in group G3', storing the identifying code of the bit line packet to which the defective bit line whose address is stored in groups G1 and G2" of memory units belongs.

Output signals of memory units OC0–OC3 of group G3' are connected to respective signal lines of bus OCBUS by means of an array of switches SW', the activation thereof being controlled by an output of an AND gate 20 having a first input supplied by the redundancy selection signal RSA generated by driver DA and a second input supplied by the internal timing signal ATD. Similarly, output signals of memory units OC0–OC3 of group G3" are connected to the respective signal lines of bus OCBUS by means of an array of switches SW" controlled by an output of an AND gate 21 having a first input supplied by the redundancy selection signal RSB generated by driver DB and a second input supplied by the internal timing signal ATD.

Memory units MU0–MU7 of groups G1 and G2' store a first defective bit line address and compare the first defective address stored therein with a current column address supplied to the memory device and carried by address signals CA0–CA7; memory units OC0–OC3 of group G3' store a four-bit identifying code suitable for identifying the bit line packet to which the first defective bit line belongs. Memory units MU0–MU7 of groups G1 and G2" store a second defective bit line address having the most significant bits in common with the first defective address, and compare the second defective address stored therein with the current address; memory units OC0–OC3 of group G3" store a four-bit identifying code suitable for identifying the bit line packet to which the second defective bit line belongs.

FIG. 3 is a diagram of the redundancy detector circuit 2. Each one of the eight redundancy selection signals RSA1–4, RSB1–4 of bus RSBUS (two redundancy selection signals RSAi, RSBi for each redundancy register RRi) supplies a gate electrode of a respective N-channel MOSFET M1–M8. All the MOSFETs M1–M8 are connected in parallel to each other between a drain electrode 5 of a P-channel MOSFET M9 and a drain electrode 7 of an N-channel MOSFET M10; M9 has a source electrode connected to a voltage supply VDD, M10 has a source electrode connected to ground; M9 and M10 are controlled by the internal timing signal ATD. The drain electrode 5 of M9 is supplied to an input of an inverter I1 whose output forms the signal RDET which is supplied to the AND gate 3 (FIG. 1). Inverter I1 also controls a P-channel MOSFET M12 connected between VDD and the drain electrode 5 of M9.

FIG. 4 shows the structure of the output buffer input selector 9. The circuit comprises sixteen (in this example referring to a memory device with a sixteen-bit output data word) switches SW91–SW916, each one having an output terminal connected to an input terminal of a respective output buffer OB1–OB16 of the memory device. Each switch SW91–SW916 is controlled by a respective signal DEC1–DEC16 of the bus DEC, generated by the decoder circuit 8. Each switch SW91–SW916 can switch the input terminal of the respective output buffer OB1–OB16 between a respective read data signal 1101–11016 of bus 110 (the output signals of the sense amplifiers 13) and the redundancy read data signal 11 generated by the redundancy sense amplifier 10.

FIG. 5 shows the structure of the decoder circuit 8. The circuit is supplied by the four signal lines OCBUS1–OCBUS4 of the identifying code bus OCBUS, and by the signal REN. The circuit comprises three inverters I2–I4 and two NAND gates 22A and 22B: inverters I2–I4 are respectively supplied by signals OCBUS1–OCBUS3 and generate complemented signals OCBUS1'–OCBUS3' thereof; NAND gate 22A is supplied by signals OCBUS4 and REN and generates a signal 23A which when signal REN is activated (high logic level) is equal to signal OCBUS4; when differently signal REN is deactivated, signal 23A is kept at the low logic level independently of the logic value of signal OCBUS4; NAND gate 22B is supplied by signal REN and the logic complement of signal OCBUS4, and generates a signal 23B which when REN is activated is equal to the logic complement of OCBUS4, otherwise signal 23B is kept at the low logic level. The circuit also comprises sixteen AND gates A1–A16, each one supplied by a respective unique combination of four of the eight signals OCBUS1–OCBUS3, OCBUS1'–OCBUS3' and 23A, 23B. Each AND gate A1–A16 generates an output signal forming one of the sixteen decoded signals DEC1–DEC16 of bus DEC.

FIG. 6 schematically shows a circuit arrangement for the generation of the internal timing signal ATD. Signals supplied to address input terminals ADD1, ADD2 . . . ADDn of the memory device supply a per-se known address buffer circuit 70 which generates the address signals of the bus CADD. The address signals CADD are conventionally supplied to an address transition detector circuit 71 (for example, a monostable circuit) which, upon transition of at least one of the address signals ADD, activates the first timing signal ATD; signal ATD switches to the low logic level and remains at the low logic level for a prescribed time, then it returns to the high logic level.

FIG. 7 shows the structure of the two address configuration detectors 4 and 6: it can be appreciated that signal ALL1 will be activated (low logic level) when the column address signal configuration is such that CA0= . . . =CA7="1"; signal AD15 is instead activated (low logic level) whenever the column address signal configuration is such that CA0= . . . =CA3="1".

Figure 8:
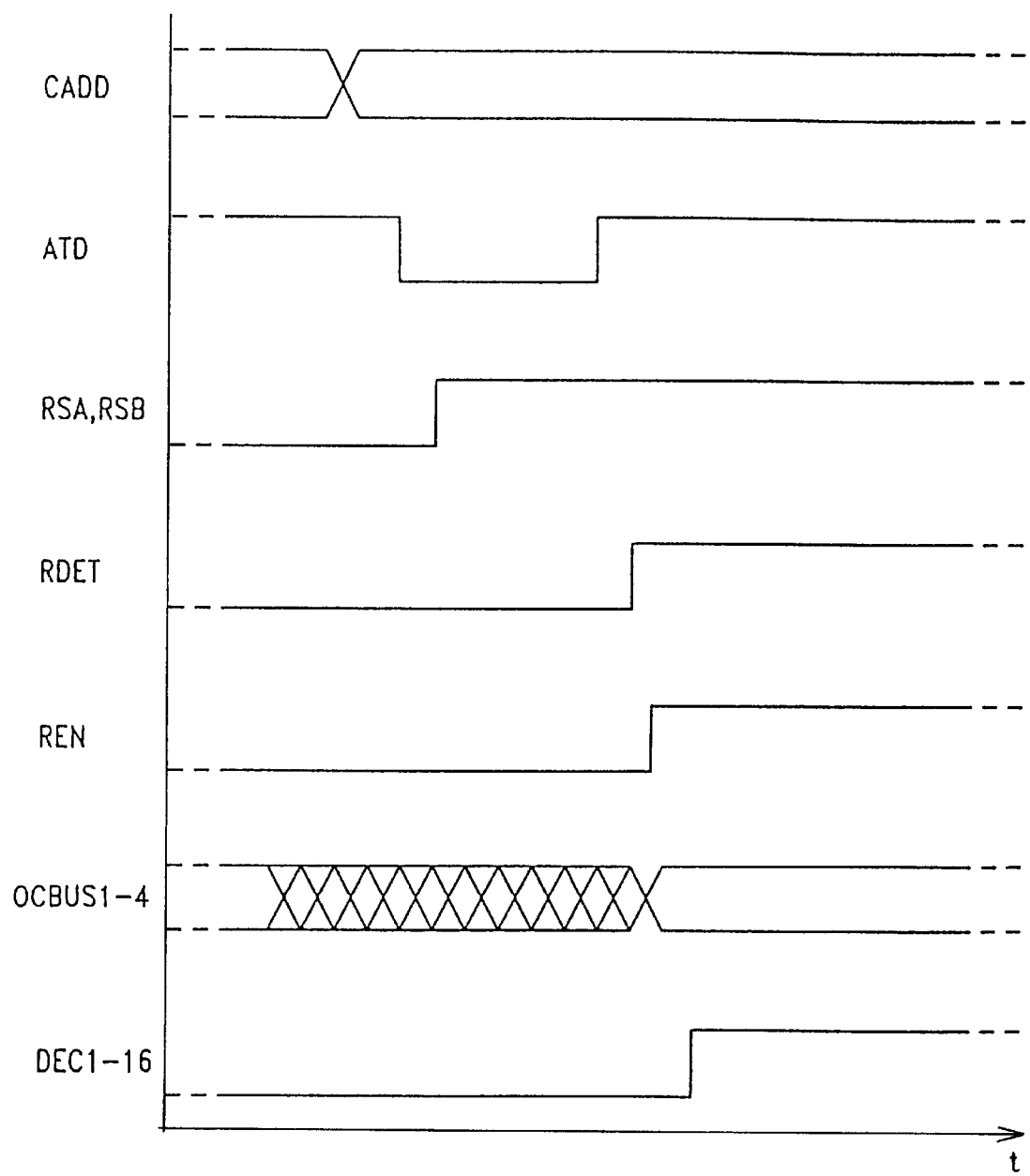
FIG. 8 is a timing diagram of some signals of the column redundancy circuit of the present invention.

The operation of the column redundancy circuit previously described will be now explained making reference to the timing diagram of FIG. 8.

During the in-factory testing of the memory device all the memory cells of the memory matrix are verified to detect the presence of defective memory cells.

In this phase, the addresses of the matrix bit lines containing defective memory cells are stored in the redundancy registers RR1–RR4. When a redundancy register is programmed for the first time, the defective bit line address is programmed in the memory units of the groups G1 and G2': group G2' stores the four least significant bits CA0–CA3 of the defective address, while group G1 stores the four most significant bits CA4–CA7 of the defective address; in group G3', a four-bit code is programmed suitable for identifying the bit line packet to which the defective bit line belongs. Group G2" can be used to store a second defective address, provided that said second defective address shares with the already programmed defective address the four most significant bits CA4–CA7. In this way, the number of memory units necessary to store two defective addresses is reduced, with a great benefit in terms of chip area.

When the memory device is operated in normal read mode, every time an address signal ADD1–ADDn changes, circuit 13 activates the normally-high internal timing signal ATD which switch to the low logic level and remains in this state for a prescribed time; signal ATD provides an internal timing signal for the memory device to perform the various phases of the read operation.

If the current column address supplied to the memory device is not a defective address, the multiplexer 12 selects one bit line in each packet of matrix bit lines BL and connects the selected bit lines to the respective sense amplifiers 13. The redundancy selection signals RSA1–4 and RSB1–4 are all deactivated. As long as signal ATD is at the low logic level, MOSFETs M9 and M10 in the redundancy detector circuit 2 are respectively on and off, and node 5 is pulled to VDD; signal RDET is deactivated (low logic level), and signal REN is also deactivated (low logic level). All the decoded output signals DEC1–DEC16 of the decoder circuit 8 are deactivated, because there is no combination of signals OCBUS1–OCBUS3, OCBUS1'–OCBUS3' and 23A, 23B for which one of the AND gates A1–A16 has four "1"s at its inputs. The situation does not change even when signal ATD returns to the high logic level: in fact, since none of the redundancy selection signals RSA, RSB is activated, signal RDET remains deactivated, and so does signal REN. Switches SW91–SW916 connect the input terminals of the output buffers OB1–OB16 to the read data signals 1101–11016 carrying the data read by the sense amplifiers 13.

It is now supposed that the current column address supplied to the memory device is a defective address. One of the redundancy selection signals RSA, RSB will be activated as a result of the comparison of the current address with the address stored in the respective redundancy register: if for example the defective address is stored in groups G1 and G2' of memory units of the redundancy register RR2, switch SW1 in RR2 will be closed and signal RSA2 will be activated; however, switches SW' are open as long as signal ATD is at the low logic level. In the redundancy detector circuit 2, MOSFET M3 will be on; however, as long as signal ATD is low, MOSFET M9 is on and MOSFET M10 is off: node 5 is therefor high and signal RDET is low. Signal REN is therefore kept deactivated as long as signal ATD is low, so that signals DEC1–DEC16 are all deactivated and the input terminals of the output buffers OB1–OB16 are connected to the outputs of the sense amplifiers 13. When after the prescribed time signal ATD returns to the high logic level, MOSFET M9 is turned off and MOSFET M10 is turned on: the input of inverter I1 is pulled to ground by M3, and signal RDET is activated. Only at this time signal REN is activated. Also, as soon as signal ATD switches to the high logic level, switches SW' in the redundancy register RR2 close to connect the output signals of memory units OC0–OC3 in group G3' to the bus OCBUS. One of the decoded signals DEC1–DEC16 will be activated according to the particular configuration of signals OCBUS1–OCBUS4, i.e. according to the identifying code stored in the redundancy register RR2. One of switches SW91–SW916 will connect the input terminal of the respective output buffer OB1–OB16 to the redundancy read data signal 11 generated by the redundancy sense amplifier 10, instead of to one of the data signals 1101–11016 generated by a sense amplifier 13 associated to the matrix bit line packet containing the defective bit line.

It can be appreciated that, at the beginning of each read cycle of the memory device, all the output buffers OB1–OB16 are coupled to the sense amplifiers 13 associated to the packets of matrix bit lines BL. This holds true even if the current address supplied to the memory device is a defective address. In the latter case, only at the end of the ATD pulse will the input terminal of one of the output buffers OB1–OB16 be switched to be coupled to the output of the redundancy sense amplifier 10 associated to the redundancy bit line packet. In this way, the access time of the memory device is reduced, because if in the next read cycle a non-defective address is supplied to the memory device it is not necessary to wait for the redundancy registers RR1–RR4 to recognize that the address is non-defective.

The provision of address configuration detectors 4 and 6 allows prevention of incorrect or even multiple selections of redundancy bit lines associated with redundancy registers not programmed. If the current address supplied to the memory device correspond to the unprogrammed configuration of the memory elements of the memory units of the redundancy registers (which in this example has been assumed to be the configuration wherein CA0=CA1= . . . =CA7="1"), circuit 4 drives signal ALL1 low; signal REN will therefore not be activated, and switches SW91–SW916 are kept in a position wherein the input terminals of output buffers OB1–OB16 are coupled to signals 1101–11016. This is important to prevent that, when the address configuration CA0= . . . =CA7="1" is supplied to the memory device, the redundancy bit lines associated with redundancy registers which have never been programmed are simultaneously selected.

Also, if the current address supplied to the memory device is such that CA0= . . . =CA3="1", circuit 6 activates signal AD15 (low logic level) which prevents the activation of all the redundancy selection signals RSB1–4: in this way, it is prevented that when such address configuration is supplied to the memory device the redundancy bit lines associated with redundancy registers wherein the second group G2" of memory units has never been programmed are simultaneously selected. This means that defective addresses having CA0= . . . =CA3="1" must be stored in groups G1 and G2' of memory units of the redundancy registers; groups G2" can be used to store defective addresses with CA0–CA3 different from CA0= . . . =CA3="1".

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Semiconductor memory device comprising:

at least one output data terminal;

a matrix of memory cells comprising a plurality of columns of memory cells;

multiplexer means associated with said matrix of memory cells for selectively coupling one of said columns to respective sensing means driving said output data terminal;

redundancy columns of redundancy memory cells for functionally replacing defective columns in said matrix;

first means for storing defective addresses of said defective columns in said matrix, for comparing said defective addresses with a current address supplied to the memory device and for selecting a redundancy column when the current address coincides with one of said defective addresses;

means for generating an internal timing signal activated upon changing of the current address supplied to the memory device, the internal timing signal remaining activated for a prescribed time starting from the beginning of a read cycle of the memory device;

redundancy sensing means associated with said redundancy columns;

redundancy control means supplied by the internal timing signal for coupling said output data terminal of the memory device to said redundancy sensing means or in alternative to said sensing means when the current address supplied to the memory device is a defective address, said redundancy control means maintaining the output data terminal of the memory device coupled to said sensing means independently of the current address being a defective address as long as the internal timing signal is activated.

2. Semiconductor memory device according to claim 1, comprising a plurality of output data terminals, each one associated with a respective packet of columns of said matrix, each packet of columns being associated with a respective sensing means, said first means comprising second means for storing, for each defective address, a respective identifying code suitable for identifying one of the column packets to which a defective column belongs, said redundancy control means comprising decoder means supplied by the identifying code of a currently addressed defective column and activated after said internal timing signal has been deactivated to couple the output data terminal associated to the column packet containing the defective column to said redundancy sensing means.

3. Semiconductor memory device according to claim 2, wherein said redundancy control means comprise an array of switch means, each one controlled by a respective decoded output signal of said decoder means, for selectively coupling a respective one of said output data terminals of the memory device to a respective sensing means associated with a respective column packet, or in alternative to said redundancy sensing means.

4. Semiconductor memory device according to claim 3, wherein said first means comprise redundancy multiplexer means for selectively coupling one redundancy column to said redundancy sensing means.

5. Semiconductor memory device according to claim 4, wherein said first means comprise a plurality of redundancy memory registers each one storing at least one defective address of a defective column, said second means comprising memory means associated with each redundancy memory register for storing, for the at least one defective address, a respective identifying code suitable for identifying the column packet to which the defective column belongs.

6. Semiconductor memory device according to claim 5, wherein each redundancy memory register is capable of storing two defective addresses having a common address part.

7. Semiconductor memory device according to claim 6, wherein each redundancy memory register comprises a first group of memory units each one storing a respective bit of said common part of the two defective addresses, a second group of memory units each one storing a respective bit of a remaining part of a first defective address, and a third group of memory units each one storing a respective bit of a remaining part of a second defective address, first logic circuit means for activating a first redundancy selection signal when the current address supplied to the memory device coincides with the first defective address and second logic circuit means for activating a second redundancy selection signal when the current address coincides with the second defective address.

8. Semiconductor memory device according to claim 7, wherein each redundancy memory register comprises a fourth group of memory units associated with said second group of memory units for storing a first identifying code associated to said first defective address, and a fifth group of memory units, associated with said third group of memory units for storing a second identifying code associated to said second defective address.

9. Semiconductor memory device according to claim 8, further comprising first address configuration detector means for detecting if the current address supplied to the memory device coincides with a default address stored in unprogrammed redundancy memory registers, and for correspondingly activating a first redundancy disable signal supplied to the redundancy control means for preventing the activation of said decoder means.

10. Semiconductor memory device according to claim 9, further comprising second address configuration detector means for detecting if the current address supplied to the memory device coincides with a default configuration stored in unprogrammed third groups of memory units of the redundancy memory registers, and for correspondingly activating a second redundancy disable signal supplied to the redundancy memory registers for preventing the activation of the second redundancy selection signals.

11. Semiconductor memory device according to claim 10, wherein the defective addresses having said remaining parts equal to said default configuration stored in the unprogrammed third groups of memory units of the redundancy memory registers are stored in the first and second groups of memory units of the redundancy memory registers.

* * * * *